(12) United States Patent
Hua

(10) Patent No.: US 12,074,087 B2
(45) Date of Patent: Aug. 27, 2024

(54) THERMAL INTERFACE MATERIAL LAYER AND USE THEREOF

(71) Applicant: NINGBO S J ELECTRONICS CO., LTD., Zhejiang (CN)

(72) Inventor: Fay Hua, Zhejiang (CN)

(73) Assignee: Ningbo S J Electronics Co., Ltd. (CN)

( * ) Notice: Subject to any disclaimer, the term of this patent is extended or adjusted under 35 U.S.C. 154(b) by 206 days.

(21) Appl. No.: 17/767,187

(22) PCT Filed: Oct. 12, 2020

(86) PCT No.: PCT/CN2020/120417
§ 371 (c)(1),
(2) Date: Apr. 7, 2022

(87) PCT Pub. No.: WO2021/068966
PCT Pub. Date: Apr. 15, 2021

(65) Prior Publication Data
US 2022/0367317 A1    Nov. 17, 2022

(30) Foreign Application Priority Data
Oct. 11, 2019  (CN) .......................... 201910964580.9

(51) Int. Cl.
*H01L 23/373*   (2006.01)
*H01L 23/00*    (2006.01)
*H01L 23/433*   (2006.01)

(52) U.S. Cl.
CPC .......... *H01L 23/3735* (2013.01); *H01L 24/16* (2013.01); *H01L 24/32* (2013.01);
(Continued)

(58) Field of Classification Search
CPC ..... H01L 23/3735; H01L 24/16; H01L 24/32; H01L 2224/16225; H01L 2224/73253;
(Continued)

(56) References Cited

U.S. PATENT DOCUMENTS

| 5,299,214 A | 3/1994 | Nakamura et al. |
| 6,504,242 B1 * | 1/2003 | Deppisch ................ H01L 24/31 |
| | | 257/714 |

(Continued)

FOREIGN PATENT DOCUMENTS

| CN | 103441109 | 12/2013 |
| CN | 110648987 A | 1/2020 |
| JP | H04430752 A | 11/1992 |

OTHER PUBLICATIONS

International Search Report for PCT/CN2020/120417 dated Jan. 13, 2021.
First Search Report for CN2019109645809.

*Primary Examiner* — Patricia D Valenzuela
(74) *Attorney, Agent, or Firm* — Scale LLP

(57) ABSTRACT

The present invention relates to a thermal interface material layer and use thereof. The thermal interface material layer comprises an indium layer and a heat dissipation cover located on one side of the indium layer; the surface of the heat dissipation cover contains a nickel layer, and the nickel layer is connected to the indium layer. In the thermal interface material layer of the present invention, the nickel layer on the surface of the heat dissipation cover is connected to the indium layer, so as to form a Ni—In compound layer having high structure stability, thereby solving the problem that the $AuIn_2$ compound layer formed by welding the indium layer and Au used as a wetting layer in the traditional thermal interface layer is easily fractured, improving the reliability of the assembly obtained by assembling same.

14 Claims, 2 Drawing Sheets

(52) U.S. Cl.
CPC ............ *H01L 23/433* (2013.01); *H01L 24/31* (2013.01); *H01L 2224/16225* (2013.01); *H01L 2224/73253* (2013.01)

(58) Field of Classification Search
CPC . H01L 23/4827; H01L 23/3675; H01L 23/42; H01L 23/433; H01L 24/31
See application file for complete search history.

(56) References Cited

U.S. PATENT DOCUMENTS

| | | |
|---|---|---|
| 8,513,800 B2 | 8/2013 | Kurita et al. |
| 2004/0188814 A1* | 9/2004 | Houle .................... H01L 23/42 438/106 |
| 2004/0262743 A1 | 12/2004 | Houle et al. |
| 2009/0183855 A1 | 7/2009 | Negoro |
| 2019/0198422 A1 | 6/2019 | Lin et al. |

* cited by examiner

THERMAL INTERFACE MATERIAL LAYER AND USE THEREOF

TECHNICAL FIELD

The present disclosure relates to the field of thermally conductive materials, and in particular to a thermal interface material layer and use thereof.

BACKGROUND

A thermal interface material is required to transfer the heat generated by the chip to the heat dissipation cover. The thermal conductivity of the thermal interface material determines whether the heat generated by CPU can be effectively dissipated. For high-end CPU, the indium sheet, a welding material based on pure indium, is commonly used for thermal interface material. Pure indium has a thermal conductivity of approximately 86 W/mk, which is the highest among welding materials. In order to weld the indium sheet with thermally conductive interface without any gaps, the design of both the back metal layer of the chip contacting with the indium sheet and the surface metal layer of the heat dissipation cover is crucially important.

The commonly used chip thermal interface material layer is developed by Intel, which includes an indium layer, and a heat dissipation cover and a back metal layer respectively located on both sides of the indium layer. The back metal layer is bonded to the chip with the side facing away the indium layer. Both of the connections, between the heat dissipation cover and the indium layer and between the back metal layer and the indium layer, adopt welding method and use an Au layer as a wetting layer. The Au layer as a wetting layer and the indium layer are bonded by welding, forming a compound layer between the two metal layers. The compound layer is the $AuIn_2$ compound layer. The defect of this solution is that the $AuIn_2$ compound layer formed at the welding position is unstable when Au is used as the wetting layer. The $AuIn_2$ compound layer, at the interface between heat dissipation cover and indium layer, often suffers fracture during the process of reliability test of the units obtained by packaging with same, causing the chips to insufficient heat dissipation and failure eventually.

Therefore, it still has great importance to improve the interface metal layer of both heat dissipation cover and indium layer in the chip thermal interface material layer, thus improving the reliability of the units obtained by packaging with same.

SUMMARY

An object of the present disclosure is to provide a thermal interface material layer and use thereof. The thermal interface material layer includes an indium layer and a heat dissipation cover located on one side of the indium layer, wherein the heat dissipation cover includes a nickel layer on its surface and the nickel layer is bonded to the indium layer. In the thermal interface material layer provided by the present disclosure, the nickel layer on the surface of the heat dissipation cover is bonded to the indium layer, which forms a Ni—In compound layer with high structural stability, thereby solving the problem of fracture readily appearing in $AuIn_2$ compound layer which is formed by welding Au as a wetting layer adopted in the conventional thermal interface material to indium layer, and improving the reliability of components assembled by same.

To achieve the object of the present disclosure, the following technical solutions are adopted.

In a first aspect, the present disclosure provides a thermal interface material layer, and the thermal interface material layer comprises an indium layer and a heat dissipation cover located on one side of the indium layer. The heat dissipation cover includes a nickel layer on its surface and the nickel layer is bonded to the indium layer.

In the conventional thermal interface material layer, the surface metal layer of the heat dissipation cover bonded to the indium layer is generally an Au layer, and $AuIn_2$ is obtained by welding the Au layer, the surface metal layer of the heat dissipation cover, to the indium layer. During the reliability test process, the $AuIn_2$ metal compound layer, at the interface between the surface metal layer of the heat dissipation cover and the indium layer, often gets fracture, resulting in the failure of chips packaged by it due to improper heat dissipation. The thermal interface material layer provided by the present disclosure comprises an indium layer and a heat dissipation cover located on one side of the indium layer. The heat dissipation cover includes a nickel layer on its surface and the nickel layer is bonded to the indium layer, wherein the indium layer is bonded to the nickel layer, the surface metal layer of the heat dissipation cover, by the means of welding, forming a Ni—In compound. Through the reliability test, it is found that the Ni—In compound layer has a property of difficult fracture, which thus solves the above problem in the prior art.

Preferably, a Ni—In compound layer is disposed at the interface between the nickel layer and the indium layer.

The Ni—In compound layer is formed during the process of welding the nickel layer and the indium layer described in the present disclosure. Before welding the nickel layer to the indium layer, the nickel layer surface is subjected to surface chemical treatment (e.g., by electrochemical deposition method, the nickel film with double-layer roughness is prepared on the surface of the nickel layer, and then the nickel film is modified by an alkanoic acid with carbon chain length more than 8, giving the nickel layer surface a contact angle close to 160° and reducing its surface energy; however, the surface chemical treatment is not limited to this method), making its surface a lower surface tension compared with the surface tension of molten indium layer, so that a state of more easily being wettable was obtained. Preferably, the nickel layer surface has a surface energy $\gamma 1$ of 75 ergs/cm² to 100 ergs/cm², such as 80 ergs/cm², 85 ergs/cm², 90 ergs/cm² or 95 ergs/cm², which is close to the surface energy of indium. The nickel layer is bonded to the indium layer by welding, obtaining the Ni—In compound layer. The Ni—In compound layer has a higher structural stability compared with the $AuIn_2$ compound layer, and is not easy to fracture, thus improving the reliability of components assembled by same.

Preferably, a material of the heat dissipation cover is copper.

Preferably, the Ni—In compound layer is obtained by welding the nickel layer and the indium layer.

Preferably, before the nickel layer and the indium layer are welded together, the nickel layer has a thickness of more than 1 μm, such as 5 μm, 8.5 μm, 9 μm, 9.5 μm, 10 μm, 10.5 μm, 11 μm or 11.5 μm.

Preferably, before the nickel layer and the indium layer are welded together, the indium layer has a thickness of 50 μm to 600 μm, such as 50 μm, 110 μm, 130 μm, 150 μm, 200 μm, 250 μm, 300 μm, 350 μm, 400 μm, 450 μm, 500 μm or 550 μm.

Preferably, the thermal interface material layer further comprises a back metal layer located on the side of the indium layer facing away the heat dissipation cover, and a nickel-vanadium alloy layer of the back metal layer is bonded to the indium layer.

The back metal layer here includes only a nickel-vanadium alloy layer. The nickel-vanadium alloy layer is adjacent to the indium layer, and the two of them are bonded by welding, and a Ni—In compound layer is formed at the welded part between the nickel-vanadium alloy layer and the indium layer.

The nickel-vanadium alloy layer here is bonded to the indium layer by welding, and before the welding, the nickel-vanadium alloy layer has a thickness of 4 μm to 10 μm, such as 5 μm, 6 μm, 7 μm, 8 μm or 9 μm.

Preferably, a Ni—In compound layer is disposed between the nickel-vanadium alloy layer and the indium layer.

Preferably, the thermal interface material layer further comprises a back metal layer located on the side of the indium layer facing away the heat dissipation cover, and an $AuIn_2$ compound layer is disposed at the junction between the back metal layer and the indium layer.

Preferably, the back metal layer further comprises a nickel-vanadium alloy layer located on the side of the $AuIn_2$ compound layer facing away the indium layer.

The back metal layer used here includes two layers: NiV alloy layer and Au layer. The Au layer is adjacent to the indium layer, and the two of them are bonded by welding. An $AuIn_2$ compound layer is obtained by welding the Au layer and the indium layer.

Preferably, a Ni—In compound layer is disposed between the $AuIn_2$ compound layer and the nickel-vanadium alloy layer.

Preferably, the $AuIn_2$ compound layer is obtained by subjecting an Au layer, which is located between the nickel-vanadium alloy layer and the indium layer, and the indium layer to a reflow process.

The reflow process described in the present disclosure refers to a reflow welding process.

Preferably, before the reflow process is carried out, the Au layer has a thickness of 0.5 μm to 2 μm, such as 0.6 μm, 0.8 μm, 1 μm, 1.2 μm, 1.5 μm or 1.8 μm.

Preferably, before the reflow process is carried out, the nickel-vanadium alloy layer of the back metal layer has a thickness of 4 μm to 10 μm, such as 4.5 μm, 5 μm, 6 μm, 7 μm, 8 μm or 9 μm.

The back metal layer generally refers to the metal layer on the back side of the semiconductor, and the back metal generally includes NiV alloy layer and Au layer, while the back metal layer of the present disclosure may adopt a two-layer structure of NiV alloy layer and Au layer (NiV alloy layer+Au layer), or NiV alloy layer only. When NiV alloy layer+Au layer is used, the $AuIn_2$ compound layer will be formed by welding Au layer and indium layer, and a Ni—In compound layer will be formed between $AuIn_2$ compound layer and NiV alloy layer; however, if only NiV alloy layer is used, just Ni—In compound layer will be formed. Before metal layer and the indium layer are welded, the Au layer used for the back metal layer has a thickness of 0 μm to 2 μm.

The thermal interface material layer provided in the present disclosure may be prepared by the following process:

depositing the nickel layer on the heat dissipation cove through electroplating, performing surface chemical treatment on the nickel layer to give its surface a lower surface tension compared with that of the molten indium layer, creating a state of more easily being wettable, and then welding the indium layer to the nickel layer surface of the heat dissipation cover.

The nickel layer on the surface of the heat dissipation cover of the thermal interface material layer described in the present disclosure is obtained by means of coating, and the connections between the indium layer and the nickel layer, between the indium layer and the nickel-vanadium alloy layer or between the indium layer and the Au layer all adopt the welding method; the Au layer on the nickel-vanadium alloy layer is obtained by means of coating.

The Au layer is generally used as a wetting layer in the heat dissipation cover of the conventional thermal interface material layer. The indium layer is welded to the Au surface, and an $AuIn_2$ compound layer will be formed at the junction of the heat dissipation cover and the indium layer. During the reliability test of the resulting assembly, it is found that the $AuIn_2$ compound layer often gets fracture, causing the chips to insufficient heat dissipation and failure eventually.

To solve the above problem, during the preparation process of the thermal interface material described in the present disclosure, the heat dissipation cover does not include an Au wetting layer, yet the surface of the nickel layer of the heat dissipation cover and facing the indium layer is subjected to a chemical treatment, giving its surface a lower surface tension compared with that of the molten indium layer, so that a state of more easily being wettable was obtained, and then the indium layer is welded to the nickel layer with the surface chemical treatment; after the above welding process, a Ni—In compound layer is formed at the junction between the heat dissipation cover and the indium layer, and according to the reliability test, it is found that the Ni—In compound layer has a high structural stability and is not easy to fracture, thus improving the reliability of the assembly.

The Au layer may or may not be adopted as a wetting layer in the welding process of the back metal layer described in the present disclosure and the indium layer.

When the Au layer is not used as the wetting layer in the back metal layer, the nickel-vanadium alloy layer of the back metal layer has a thickness of 4 μm to 10 μm, such as 5 μm, 6 μm, 7 μm, 8 μm or 9 μm. The nickel-vanadium alloy layer of the back metal layer is subjected to surface chemical treatment, giving its surface a lower surface tension compared with that of the molten indium layer, creating a state of more easily being wettable; then the indium layer and the nickel-vanadium alloy layer are bonded by welding, and a Ni—In compound layer at the junction of the back metal layer and the indium layer, thereby achieving the object of improving the reliability of the thermal interface material layer.

When the Au layer is used as the wetting layer, the Au layer has a thickness of 0.2 μm to 2 μm. The Au layer and the indium layer are bonded by welding, and an $AuIn_2$ compound layer is formed between the back metal layer and the indium layer. Meanwhile, due to the thin thickness of the Au wetting layer, a Ni—In compound layer will be formed between the $AuIn_2$ compound layer and the nickel-vanadium alloy layer during the welding process.

In a second aspect, the present disclosure provides use of the thermal interface material layer as described in the first aspect, and the thermal interface material layer is used for chip heat dissipation.

The thermal interface material layer described in the present disclosure is used for chip packaging and heat dissipation.

Compared with the prior art, the present disclosure has the following beneficial effects.

(1) The thermal interface material layer of the present disclosure includes an indium layer and a heat dissipation cover located on one side of the indium layer. The nickel layer on the surface of the heat dissipation cover is bonded to the indium layer, and a Ni—In compound layer is formed at the interface between those two layers. The Ni—In compound layer has a higher structural stability compared with the $AuIn_2$ compound layer and is not easy to fracture, thus giving the thermal interface material layer a higher reliability.

(2) No Au wetting layer is used in the heat dissipation cover of the thermal interface material layer described in the present disclosure, which makes the production cost of the thermal interface material layer significantly reduce.

REFERENCE LIST

1—thermally conductive material layer; 2—heat dissipation cover; 3—chip; 4—solder ball; 5—carrier substrate; 6—sealant; 7—indium layer; 8—nickel layer; 9—Au layer; 10—nickel-vanadium alloy layer; 11—Ni—In compound layer; 12—$AuIn_2$ compound layer.

DETAILED DESCRIPTION

The technical solutions of the present disclosure are further described below through specific embodiments. Those skilled in the art should understand that the examples are merely used for a better understanding of the present disclosure and should not be construed as specific limitations to the present disclosure.

Figure 1:
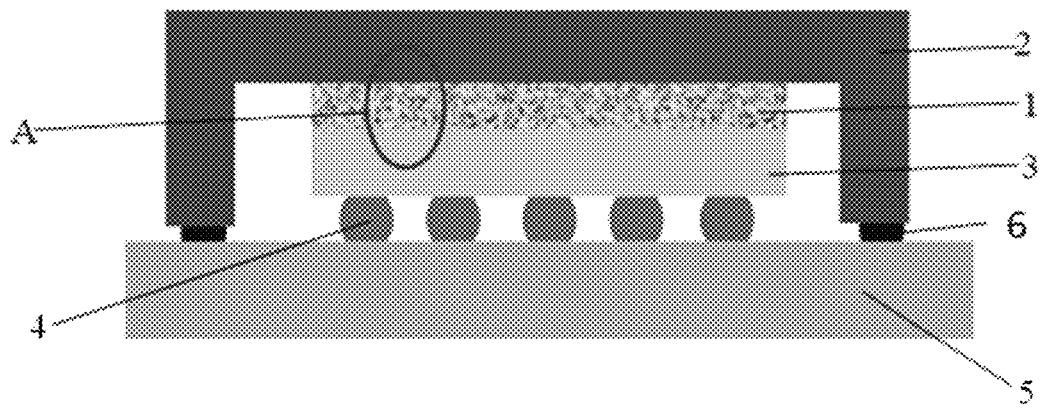
FIG. 1 is a schematic diagram of the central processing unit (CPU) package, in which area A is a partial view of the thermal interface material layer.

A schematic diagram of a typical central processing unit (CPU) package is shown in FIG. 1. It can be seen from the figure that the package structure has the following layers. A thermally conductive material layer 1 employs an indium layer. A heat dissipation cover 2, located on one side of thermally conductive material layer 1, has a metal layer on its surface of the side facing the thermally conductive material layer, and the metal layer is bonded to the thermally conductive material layer 1. A chip 3 is located on the side of the thermally conductive material layer 1 facing away the heat dissipation cover 2. A back metal layer is disposed between the chip 3 and the thermally conductive material layer 1. The side of the chip 3 facing away the back metal layer is secured to a carrier substrate 5 through BGA composed of a solder ball 4. A protrusion, on the edge of the heat dissipation cover 2, is secured to the carrier substrate 5 with a sealant 6. Area A of the figure shows a partial view of the thermal interface material layer, which includes the heat dissipation cover, the surface metal layer of heat dissipation cover, the thermally conductive material layer bonded to the surface metal layer of heat dissipation cover and the back metal layer located on the side of the thermally conductive material layer facing away the heat dissipation cover, wherein the back metal layer is bonded to the chip.

The nickel layer or the nickel layer and the Au layer, on the surface of the heat dissipation cover of the thermal interface material layer described in the examples of the present disclosure, are obtained by means of coating, and the connections between the indium layer and the nickel layer, between the indium layer and the nickel-vanadium alloy layer or between the indium layer and the Au layer all adopt the welding method; the Au layer on the nickel-vanadium alloy layer is obtained by means of coating.

EXAMPLE 1

Figure 2:
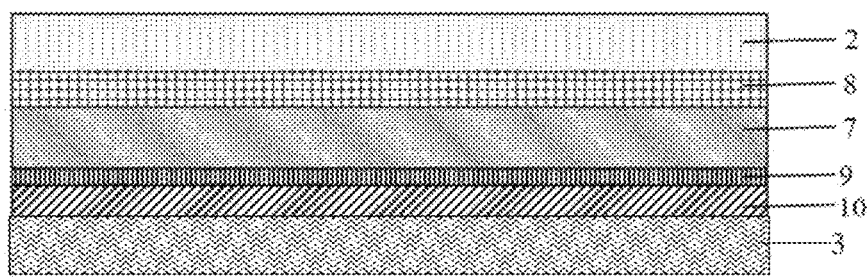
FIG. 2 is a schematic structure diagram of the various layers of the thermal interface material layer described in Example 1 provided in the present disclosure before the layers are bonded.

The schematic structure diagram of the various layers of the thermal interface material layer described in this example before the layers are bonded is shown in FIG. 2. As can be seen from the figure, the various layers of the thermal interface material layer before bonded included an indium layer 7 and a heat dissipation cover 2 located on one side of the indium layer, a nickel layer 8 arranged on the side of the heat dissipation cover 2 facing the indium layer 7, and a back metal layer arranged on the side of the indium layer 7 facing away the heat dissipation cover 2, wherein the back metal layer had an Au layer 9 on its side facing the indium layer 7 and a nickel-vanadium alloy layer 10 located on the side of Au layer 9 facing away indium layer 7 as well. The side of back metal layer facing away the indium layer 7 was adjacent to a chip 3. The heat dissipation cover was made of copper; the nickel layer 8 had a thickness of 10 μm; the indium layer 7 had a thickness of 230 μm; the Au layer 9 had a thickness of 1 μm; and the nickel-vanadium alloy layer 10 had a thickness of 8 μm. A surface chemical treatment was subjected to the surface on the side of nickel layer 8 facing the indium layer 7, giving a lower surface tension to nickel layer surface than the surface tension of molten indium layer, so that a state of more easily being wettable was obtained. Electrochemical deposition was carried out to prepare a nickel film with double-layer roughness on the nickel layer surface in this example, and then the nickel film was modified by an alkanoic acid with carbon chain length more than 8, giving the nickel layer surface a contact angle close to 160° and reducing its surface energy to 90 ergs/cm².

Figure 3:
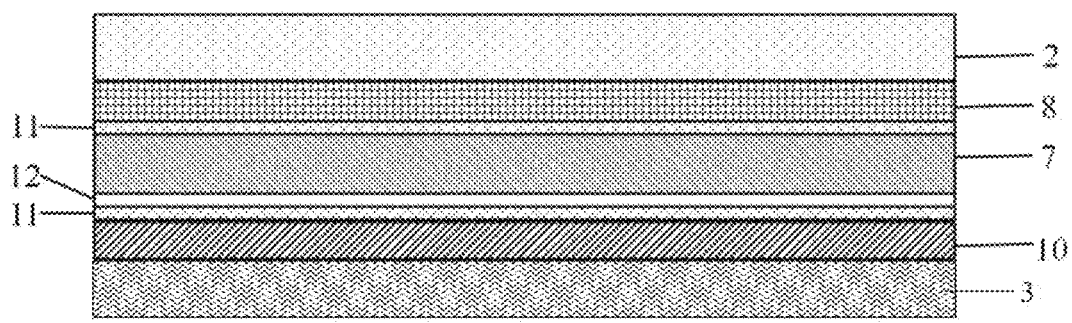
FIG. 3 is a schematic structure diagram of the various layers of the thermal interface material layer described in Example 1 provided in the present disclosure after the layers are bonded.

The schematic structure diagram of the various layers of the thermal interface material layer described in this example after the layers are bonded is shown in FIG. 3. As can be seen from the figure, the thermal interface material layer included an indium layer 7 and a heat dissipation cover 2 located on one side of the indium layer, a nickel layer 8 arranged on the side of the heat dissipation cover 2 facing the indium layer 7, a Ni—In compound layer 11 disposed at the connecting part between the nickel layer 8 and the indium layer 7, a back metal layer arranged on the side of the indium layer 7 facing away heat dissipation cover 2, and an AuIn$_2$ compound layer 12 disposed at the connecting part between the back metal layer and the indium layer 7. The back metal layer further included a nickel-vanadium alloy layer 10 located on the side of AuIn$_2$ compound layer 12 facing away the indium layer 7. A Ni—In compound layer 11 disposed between the nickel-vanadium alloy layer 10 and the AuIn$_2$ compound layer 12.

EXAMPLE 2

Figure 4:
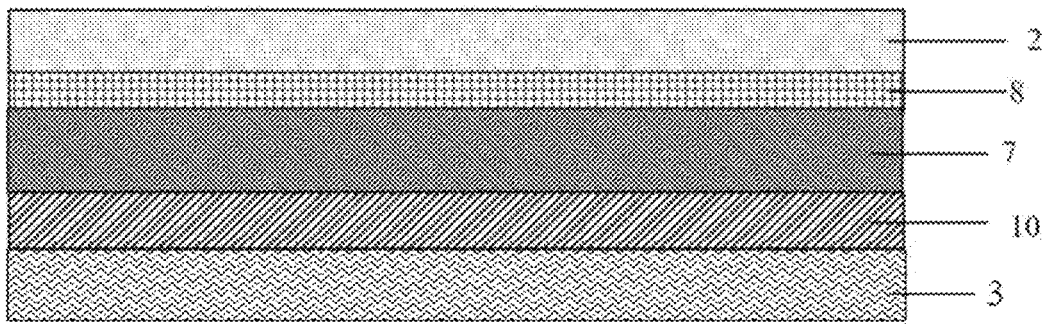
FIG. 4 is a schematic structure diagram of the various layers of the thermal interface material layer described in Example 2 provided in the present disclosure before the layers are bonded.

The schematic structure diagram of the various layers of the thermal interface material layer described in this example before the layers are bonded is shown in FIG. 4. As can be seen from the figure, the various layers of the thermal interface material layer before bonded included an indium layer 7 and a heat dissipation cover 2 located on one side of the indium layer, a nickel layer 8 arranged on the side of the heat dissipation cover 2 facing the indium layer 7, and a back metal layer arranged on the side of the indium layer 7 facing away the heat dissipation cover 2, wherein the back metal layer had a nickel-vanadium alloy layer 10 and was adjacent to a chip 3 with its side facing away the indium layer 7. The heat dissipation cover was made of copper; the nickel layer 8 had a thickness of 10 μm; the indium layer 7 had a thickness of 200 μm; and the nickel-vanadium alloy layer had a thickness of 5 μm. A surface chemical treatment was subjected to the surface on the side of nickel layer 8 facing the indium layer 7, giving a lower surface tension to nickel layer surface than the surface tension of molten indium layer, so that a state of more easily being wettable was obtained. A surface chemical treatment was subjected to the surface on the side of nickel-vanadium alloy layer 10 facing the indium layer 7, giving a lower surface tension to nickel-vanadium alloy layer surface than the surface tension of molten indium layer, so that a state of more easily being wettable was obtained. The surface energy of the nickel layer reached 85 ergs/cm$^2$ after the nickel layer was treated according to the method as described in the Example 1, and the surface energy of the nickel-vanadium alloy layer was 80 ergs/cm$^2$ after the surface was treated.

Figure 5:
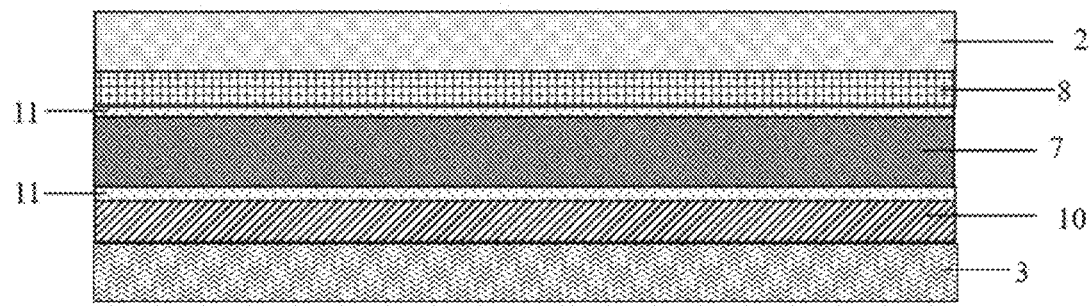
FIG. 5 is a schematic structure diagram of the various layers of the thermal interface material layer described in Example 2 provided in the present disclosure after the layers are bonded.

The schematic structure diagram of the various layers of the thermal interface material layer described in this example after the layers are bonded is shown in FIG. 5. As can be seen from the figure, the thermal interface material layer included an indium layer 7 and a heat dissipation cover 2 located on one side of the indium layer, a nickel layer 8 arranged on the side of the heat dissipation cover 2 facing the indium layer 7, a Ni—In compound layer 11 disposed at the connecting part between the nickel layer 8 and the indium layer 7, and a back metal layer arranged on the side of the indium layer 7 facing away heat dissipation cover 2. The back metal layer included a nickel-vanadium alloy layer 10, and a Ni—In compound layer 11 disposed between the nickel-vanadium alloy layer 10 and the indium layer 7.

COMPARATIVE EXAMPLE 1

Figure 6:
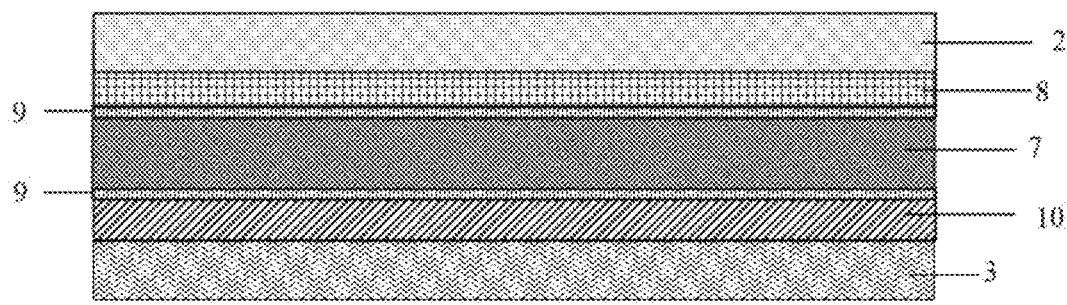
FIG. 6 is a schematic structure diagram of the various layers of the thermal interface material layer described in Comparative Example 1 provided in the present disclosure before the layers are bonded.

The schematic structure diagram of the various layers of the thermal interface material layer described in this comparative example before the layers are bonded is shown in FIG. 6. As can be seen from the figure, the various layers of the thermal interface material layer before bonded included an indium layer 7 and a heat dissipation cover 2 located on one side of the indium layer, a nickel layer 8 arranged on the side of the heat dissipation cover facing the indium layer, an Au layer 9 disposed on the nickel layer 8 surface, and a back metal layer arranged on the side of the indium layer 7 facing away the heat dissipation cover 2, wherein the back metal layer had an Au layer 9 as well as a nickel-vanadium alloy layer 10 that was located on the side of Au layer 9 facing away indium layer 7. The back metal layer was adjacent to a chip 3 with its side facing away the indium layer 7. The heat dissipation cover was made of copper; the nickel layer 8 had a thickness of 10 μm; the Au layer of the heat dissipation cover had a thickness of 1 μm; the indium layer 7 had a thickness of 600 μm; the Au layer of the back metal layer had a thickness of 1 μm; and the nickel-vanadium alloy layer had a thickness of 8 μm.

Figure 7:
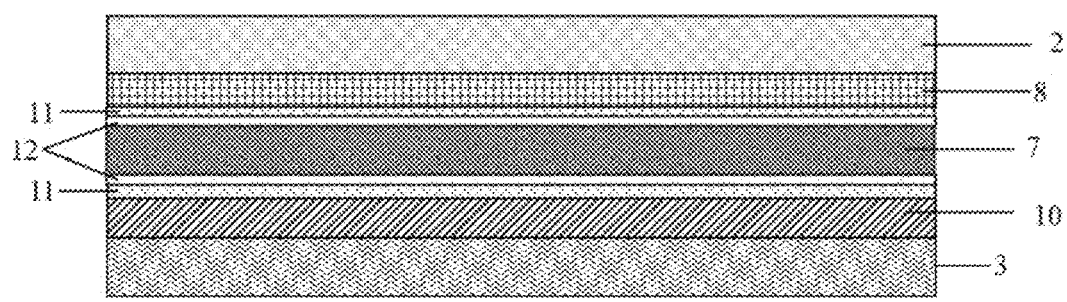
FIG. 7 is a schematic structure diagram of the various layers of the thermal interface material layer described in Comparative Example 1 provided in the present disclosure after the layers are bonded.

The schematic structure diagram of the various layers of the thermal interface material layer described in this comparative example after the layers are bonded is shown in FIG. 7. As can be seen from the figure, the thermal interface material layer included an indium layer 7 and a heat dissipation cover 2 located on one side of the indium layer, a nickel layer 8 arranged on the side of the heat dissipation cover 2 facing the indium layer 7, an AuIn$_2$ compound layer disposed between the nickel layer and the indium layer, a Ni—In compound layer disposed between the AuIn$_2$ compound layer and the nickel layer, and a back metal layer arranged on the side of the indium layer 7 facing away heat dissipation cover 2, and an AuIn$_2$ compound layer 12 disposed at the connecting part between the back metal layer and the indium layer 7. The back metal layer also included a nickel-vanadium alloy layer 10 located on the side of AuIn$_2$ compound layer 12 facing away the indium layer 7, and a Ni—In compound layer 11 disposed between the nickel-vanadium alloy layer 10 and the AuIn$_2$ compound layer 12.

Performance Test Method

A reliability test was performed on the thermal interface material layer obtained from Examples 1-2 and Comparative Example 1. The test method is performed as follows: carrying out a high and low temperature impact cycle test to determine the cycle number before failure. The specific method included: a sample was rapidly heated to 125° C., and the temperature was maintained for 15 min; then the temperature was cooled to −55° C. and maintained for 15 min. That could be called a cycle. Then a plurality of cycles were performed repetitively and whether the weld surface got fracture failure was monitored continuously. The number of cycles was utilized as the basis for appraisal about good or bad. The cycle number was at least 1000 times, generally 3000 times.

During 3000 cycles in high and low temperature impact cycle test, the weld surface, of the thermal interface material layer obtained from Examples 1-2, did not get fracture failure, which might maintain the reliability for more than 10 years, while a problem of weld surface fracture appeared on the thermal interface material layer obtained from Comparative Example 1, after 1000 cycles in high and low temperature impact cycle test. Therefore, the thermal interface material layer described in the present disclosure has a higher structural stability.

According to the reliability test hereinabove, it is found that the Ni—In compound layer has better structural stability and is not easy to fracture, which is formed by welding the indium layer with the Ni layer on the surface of the heat dissipation cover of the thermal interface material layer described in Examples 1-2 of the present disclosure, while the AuIn$_2$ compound layer, which is formed by welding the indium layer with the Au layer employed as a wetting layer of the heat dissipation cover of the thermal interface material layer in Comparative Example 1, is structurally unstable and easy to fracture, thereby causing relatively poor reliability to the central processing unit obtained by packaging with same.

The applicant has stated that what described above is merely specific implementations of the present disclosure, and protection extent of the present disclosure is not limited thereto, and it should be apparent to those skilled in the art that any readily obvious variations or replacements, within the technical scope disclosed by the present disclosure for those skilled in the art, all fall in the protection and disclosure scope of the present disclosure.

What is claimed is:

1. A thermal interface material layer, comprising an indium layer and a heat dissipation cover located on one side of the indium layer, wherein the heat dissipation cover has a nickel layer on the surface, and the nickel layer is bonded to the indium layer;
   wherein a nickel film with double-layer roughness is located on a contacting point between a surface of the nickel layer and the indium layer; the nickel film is prepared on the surface of the nickel layer by electrochemical deposition, and is subjected to modification by an alkanoic acid with carbon chain length more than 8, which makes the nickel film a lower surface tension compared with a surface tension of molten indium layer; and
   wherein a Ni—In compound layer is disposed at the interface between the nickel layer and the indium layer.

2. The thermal interface material layer according to claim 1, wherein a material of the heat dissipation cover is copper.

3. The thermal interface material layer according to claim 1, wherein the Ni—In compound layer is obtained by welding the nickel layer and the indium layer.

4. The thermal interface material layer according to claim 3, wherein the nickel layer has a thickness more than 1 μm, before the nickel layer and the indium layer are welded.

5. The thermal interface material layer according to claim 3, wherein the indium layer has a thickness of 50 μm to 600 μm, before the nickel layer and the indium layer are welded.

6. The thermal interface material layer according to claim 1, wherein the thermal interface material layer further comprises a back metal layer located on the side of the indium layer facing away the heat dissipation cover, wherein a nickel-vanadium alloy layer of the back metal layer is bonded to the indium layer.

7. The thermal interface material layer according to claim 6, wherein a Ni—In compound layer is disposed between the nickel-vanadium alloy layer and the indium layer.

8. The thermal interface material layer according to claim 1, wherein the thermal interface material layer further comprises a back metal layer located on the side of the indium layer facing away the heat dissipation cover, wherein an AuIn$_2$ compound layer is disposed at the junction between the back metal layer and the indium layer.

9. The thermal interface material layer according to claim 8, wherein the back metal layer further comprises a nickel-vanadium alloy layer located on the side of the AuIn$_2$ compound layer facing away the indium layer.

10. The thermal interface material layer according to claim 9, wherein a Ni—In compound layer is disposed between the AuIn$_2$ compound layer and the nickel-vanadium alloy layer.

11. The thermal interface material layer according to claim 9, wherein the AuIn$_2$ compound layer is obtained by subjecting an Au layer, which is located between the nickel-vanadium alloy layer and the indium layer, and the indium layer to a reflow process.

12. The thermal interface material layer according to claim 11, wherein the Au layer has a thickness of 0 μm to 2 μm, before the reflow process is carried out.

13. The thermal interface material layer according to claim 11, wherein the nickel-vanadium alloy layer in the back metal layer has a thickness of 4 μm to 10 μm, before the reflow process is carried out.

14. A method for chip heat dissipation using the thermal interface material layer according to claim 1.

* * * * *